United States Patent
Kidoh

(10) Patent No.: US 7,187,101 B2
(45) Date of Patent: Mar. 6, 2007

(54) SURFACE ACOUSTIC WAVE FILTER

(75) Inventor: Hideo Kidoh, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 116 days.

(21) Appl. No.: 10/763,178

(22) Filed: Jan. 26, 2004

(65) Prior Publication Data

US 2004/0150292 A1 Aug. 5, 2004

(30) Foreign Application Priority Data

Feb. 4, 2003 (JP) ............................ 2003-027662
Nov. 5, 2003 (JP) ............................ 2003-375990

(51) Int. Cl.
*H03H 9/25* (2006.01)
*H03H 9/46* (2006.01)

(52) U.S. Cl. ............................ 310/313 A; 310/313 B; 310/363; 333/193

(58) Field of Classification Search ............ 310/313 R, 310/313 A, 313 B, 361, 363; 333/193
See application file for complete search history.

(56) References Cited

U.S. PATENT DOCUMENTS

| | | | | |
|---|---|---|---|---|
| 4,340,834 A | * | 7/1982 | Sato | ........................ 310/313 D |
| 4,672,255 A | * | 6/1987 | Suzuki et al. | ............ 310/313 A |
| 5,189,330 A | * | 2/1993 | Niitsuma | ................. 310/313 B |
| 5,703,427 A | | 12/1997 | Solal et al. | |
| 6,271,617 B1 | * | 8/2001 | Yoneda et al. | .......... 310/313 D |
| 6,462,698 B2 | * | 10/2002 | Campbell et al. | .............. 342/51 |
| 6,476,691 B1 | * | 11/2002 | Tsuzuki et al. | .............. 333/193 |
| 6,791,236 B1 | * | 9/2004 | Abramov | ................. 310/313 B |
| 6,946,930 B2 | * | 9/2005 | Kadota et al. | ............... 333/195 |
| 2002/0057035 A1 | * | 5/2002 | Nakamura et al. | ....... 310/313 B |
| 2002/0074899 A1 | * | 6/2002 | Nakao et al. | ............ 310/313 R |
| 2002/0125970 A1 | * | 9/2002 | Tsuzuki et al. | .............. 333/193 |
| 2003/0129307 A1 | * | 7/2003 | Lu et al. | ................. 427/255.28 |
| 2004/0164645 A1 | * | 8/2004 | Oshio | ..................... 310/313 B |

FOREIGN PATENT DOCUMENTS

| | | | |
|---|---|---|---|
| JP | 2000-091869 | | 3/2000 |
| JP | 2000-124763 | * | 4/2000 |
| JP | 2001-053581 | | 2/2001 |
| JP | 2001-332955 | | 11/2001 |

OTHER PUBLICATIONS

Toshikazu Kodama et al.; "Design of Low-Loss SAW Filters Employing Distributed Acoustic Reflection Transducers"; '86/10 vol. J69-C No. 10; pp. 1297-1308.

* cited by examiner

*Primary Examiner*—Thomas M. Dougherty
(74) *Attorney, Agent, or Firm*—Keating & Bennett, LLP

(57) ABSTRACT

In a surface acoustic wave filter, an input-side IDT electrode and an output-side IDT electrode are arranged on a piezoelectric substrate so as to be separated from each other in the propagation of a surface acoustic wave. The thickness of the IDT electrodes is set so that the first coefficient of the velocity-dispersion has a negative value.

4 Claims, 13 Drawing Sheets

SURFACE ACOUSTIC WAVE FILTER

BACKGROUND OF THE INVENTION

1. Field of the Invention

The present invention relates to a surface acoustic wave filter for use as, e.g., a band filter and, more particularly, to a transversal type surface acoustic wave filter in which an electrode including an electrode layer of Al or an Al alloy is provided on a crystal substrate.

2. Description of the Related Art

Known transversal type surface acoustic wave filters are used as IF filters in portable telephones. However, the transversal type surface acoustic wave filters have problems in that the insertion loss is large.

Thus, heretofore, different types of surface acoustic wave filters have been proposed which include unidirectional electrodes for reducing the insertion loss.

IEICE Trans. '86/10 Vol. J69-C No. 10 (p 1297–1308) (Non-patent Document 1) describes a method of designing a SPUDT (Single Phase Uni-Directional Transducer) which is a kind of unidirectional electrode. According to the description of Non-patent Document 1, when a SPUDT is designed, the reflection is weighted such that the reflected wave in IDT is cancelled out. Thereby, the loss is reduced, and moreover, a ripple, caused by triple transit echo (TTE), is reduced.

On the other hand, the bandwidth of a filter is determined by the weighted excitation in the IDT. Accordingly, to improve the shape factor, i.e., the steepness of the filter characteristic and realize a narrow bandwidth, the number of pairs of electrode fingers must be increased in the IDT. Therefore, there have been problems in that it is difficult to reduce the size of the filter.

To solve the above-described problems, U.S. Pat. No. 5,703,427 (Patent Document 1) discloses a configuration of a SPUDT with which the size is reduced, the shape factor is improved, and a narrow band is produced. That is, reflection elements are arranged in the forward and reverse directions in the IDT, such that local resonance is generated, and thereby, the duration time of an impulse is increased. Thus, the size of the IDT is reduced.

Moreover, Japanese Unexamined Patent Application Publication Nos. 2000-91869 (Patent Document 2), 2001-53581 (Patent Document 3), and 2001-332955 (Patent Document 4) disclose surface acoustic wave filters using SPUDT electrodes. Moreover, Patent Documents 2 to 4 describe structures in which SPUDT electrodes made of Al are provided on Y-cut crystal substrates. Furthermore, Patent Documents 2 to 4 describe that preferably, the electrode film thickness ratio h/λ is in the range of 0.005 to 0.035, wherein h represents the electrode film-thickness, and λ represents the wavelength of a surface acoustic wave.

According to the structure using a SPUDT in the surface acoustic wave filter described in Patent Document 1, the size is significantly reduced, and the shape factor is improved, as described above. Although significant reduction in size has been achieved, requirements for size-reduction and the improvement of the shape factor or the formation of a narrow band are contradictory to each other. Thus, the known technique described in Patent Document 1 does not sufficiently meet the above-described requirements.

Particularly, reception-side band filters for use in CDMA One of portable telephones are required to have excellent characteristics such as a narrow band e.g., having a specific bandwidth of about 1.1%, and a superior shape factor. Moreover, surface acoustic have filters having a reduced size have been in great demand.

Thus, the surface acoustic wave filter described in Patent Document 1 is insufficient to meet the above-described severe requirements. Particularly, the size reduction of elements is required. According to the surface acoustic wave filter using an R-SPUDT described in Patent Document 1, it is very difficult to further reduce the size of the surface acoustic wave filter while ensuring the filter has a narrow band and a superior shape factor.

SUMMARY OF THE INVENTION

To overcome the problems described above, preferred embodiments of the present invention provide a surface acoustic wave filter in which, while the size of the filter is increased, the shape factor is improved, and the bandwidth is decreased.

According to preferred embodiments of the present invention, a surface acoustic wave filter includes a piezoelectric substrate, an input-side IDT electrode and an output-side IDT electrode arranged on the piezoelectric substrate so as to be separated from each other in the propagation direction of a surface acoustic wave, the input-side electrode and the output-side electrode having a thickness at which the velocity-dispersion of the filter has a negative value.

Preferably, the piezoelectric substrate is a crystal substrate. In addition, preferably, the input-side IDT electrode and the output-side IDT electrode each include an electrode layer made of Al or an Al alloy as a major electrode layer, and the electrode film thickness ratio h/λ is preferably in the range of from about 0.035 to about 0.06, wherein h represents the film-thickness of the input-side IDT electrode and the output-side IDT electrode, and λ represents the wavelength of the surface acoustic wave.

Preferably, the surface acoustic wave filter further includes at least one electrode layer laminated to the electrode layer made of Al or an Al alloy, the at least one electrode layer being made of a metal excluding Al.

Preferably, at least one of the input-side IDT electrode and the output-side IDT electrode is an SPUDT electrode.

Also, preferably, the crystal substrate is an ST-cut crystal substrate having an Euler's angle (0, θ, 0) in the range represented by θ={−3·(H/λ)×100+134}±1.

As described above, in the surface acoustic wave filter of preferred embodiments of the present invention, the thickness of the input-side IDT electrode and the output-side IDT electrode is selected such that the first coefficient of the velocity-dispersion has a negative value. Thus, the surface acoustic wave filter has an improved shape factor, a reduced size, and a narrow bandwidth.

In preferred embodiments of the present invention, different types of piezoelectric materials may be used for the piezoelectric substrate. Particularly, when a crystal substrate is used as the piezoelectric substrate, a combination of the crystal substrate with an electrode made of Al or an Al alloy which is inexpensive enables the first coefficient of the velocity-dispersion to have a negative value. In the case in which the input-side IDT electrode and the output-side IDT electrode on the crystal substrate include an electrode layer made of Al or an Al alloy as a major electrode layer, and the electrode film thickness ratio h/λ is preferably in the range of about 0.035 to about 0.06, the first coefficient of the velocity-dispersion has a negative value. Thus, the surface acoustic wave filter has a reduced size and a narrow bandwidth.

In the case in which at least one of the input-side IDT electrode and the output-side IDT electrode includes an SPUDT electrode, the shape factor is improved, the size is reduced, and the bandwidth is narrow.

In the case in which the angle θ of the Euler's angle (0, θ, 0) is in the range represented by the above-described formula (3), the temperature stability of the frequency of the surface acoustic wave filter is greatly improved.

Other features, elements, characteristics, steps and advantages of the present invention will become more apparent from the following detailed description of preferred embodiments with reference to the attached drawings.

DETAILED DESCRIPTION OF PREFERRED EMBODIMENTS

Hereinafter, the present invention will be made clear by description of the preferred embodiments of the present invention made with reference with the accompanying drawings.

First Preferred Embodiment

Figure 1A:
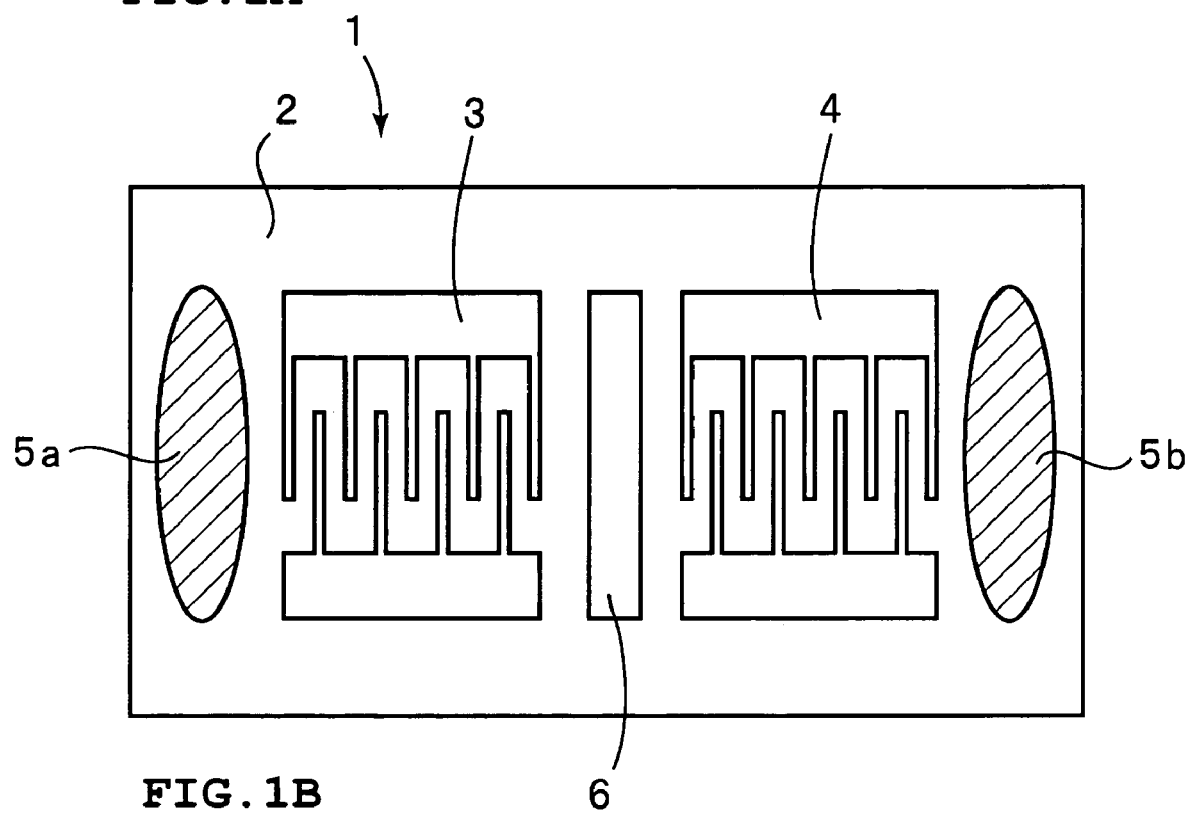
FIG. 1A is a schematic plan view of a surface acoustic wave filer according to a preferred embodiment of the present invention.
Figure 1B:
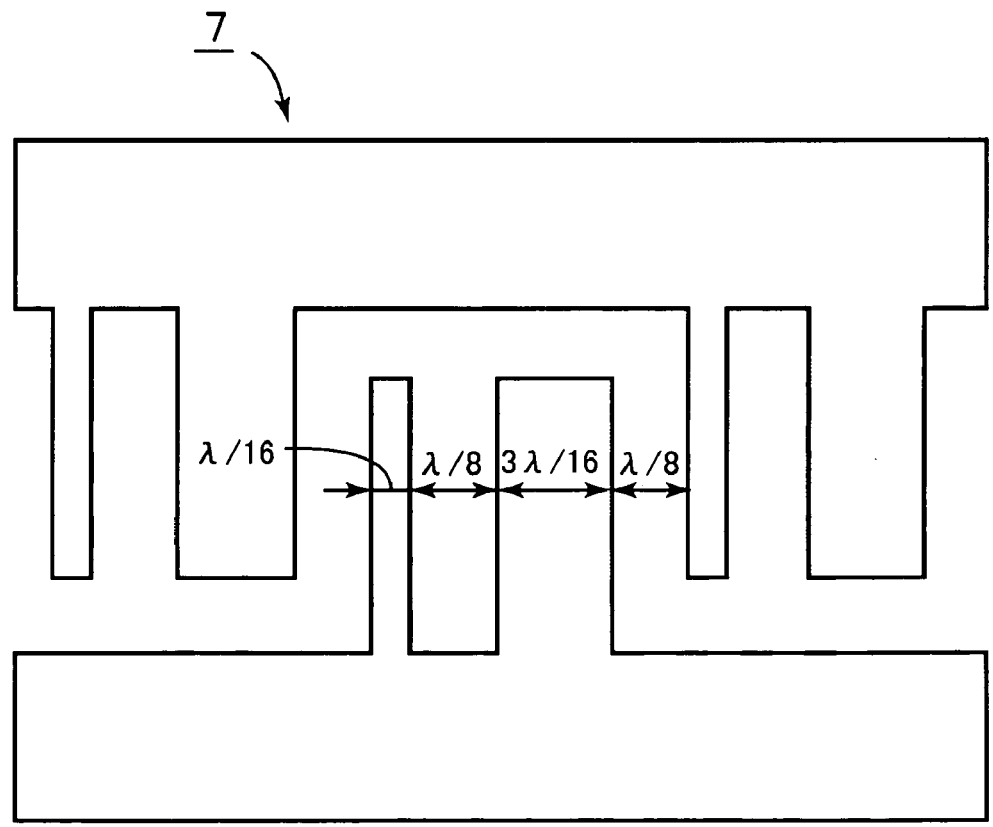
FIG. 1B is a schematic plan view of an SPUDT electrode used in the surface acoustic wave filter.

FIG. 1A is a schematic plan view of a surface acoustic wave filter according to a preferred embodiment of the present invention, and FIG. 1B is a schematic plan view of SPUDT used in the surface acoustic wave filter.

A surface acoustic wave filter 1 preferably includes an ST-cut crystal substrate 2, e.g., having an Euler's angle (0, 116, 0). An input-side IDT electrode 3 and an output-side IDT electrode 4 are arranged on the crystal substrate 2 so as to be separated from each other in the propagation direction of a surface acoustic wave. Moreover, a shield electrode 6 is provided between the IDT electrodes 3 and 4. In this preferred embodiment, each of the input-side IDT electrode 3 and the output-side IDT electrode 4 preferably includes an SPUDT electrode 7 having an unbalanced dual finger structure shown in FIG. 1B. The SPUDT electrode 7 will be described in detail below.

An electrode finger having a width of about $\lambda/16$ and an electrode finger having a width of about $3\lambda/16$, these electrode fingers having the same polarities, are paired and arranged so as to be spaced apart a distance of about $\lambda/8$. The pairs of the fingers are periodically arranged in the propagation direction of a surface acoustic wave.

The IDT electrodes 3 and 4 are preferably formed by a lift-off method.

The input-side IDT electrodes 3 and the output-side IDT electrodes 4 are preferably made of Al, and the film-thickness h is set such that the electrode film thickness ratio h/λ is preferably equal to about 0.06, for example. In this specification, the electrode film thickness ratio is defined as h/λ wherein h represents the thickness of an electrode film, and λ represents the wavelength of a surface acoustic wave. Since the electrode film thickness ratio h/λ is preferably about 0.06 as described above, the first coefficient of the velocity dispersion has a negative value as described below. Thus, a narrow bandwidth and a superior shape factor are achieved. This will be described with reference to FIG. 2 and FIG. 3.

Figure 2:
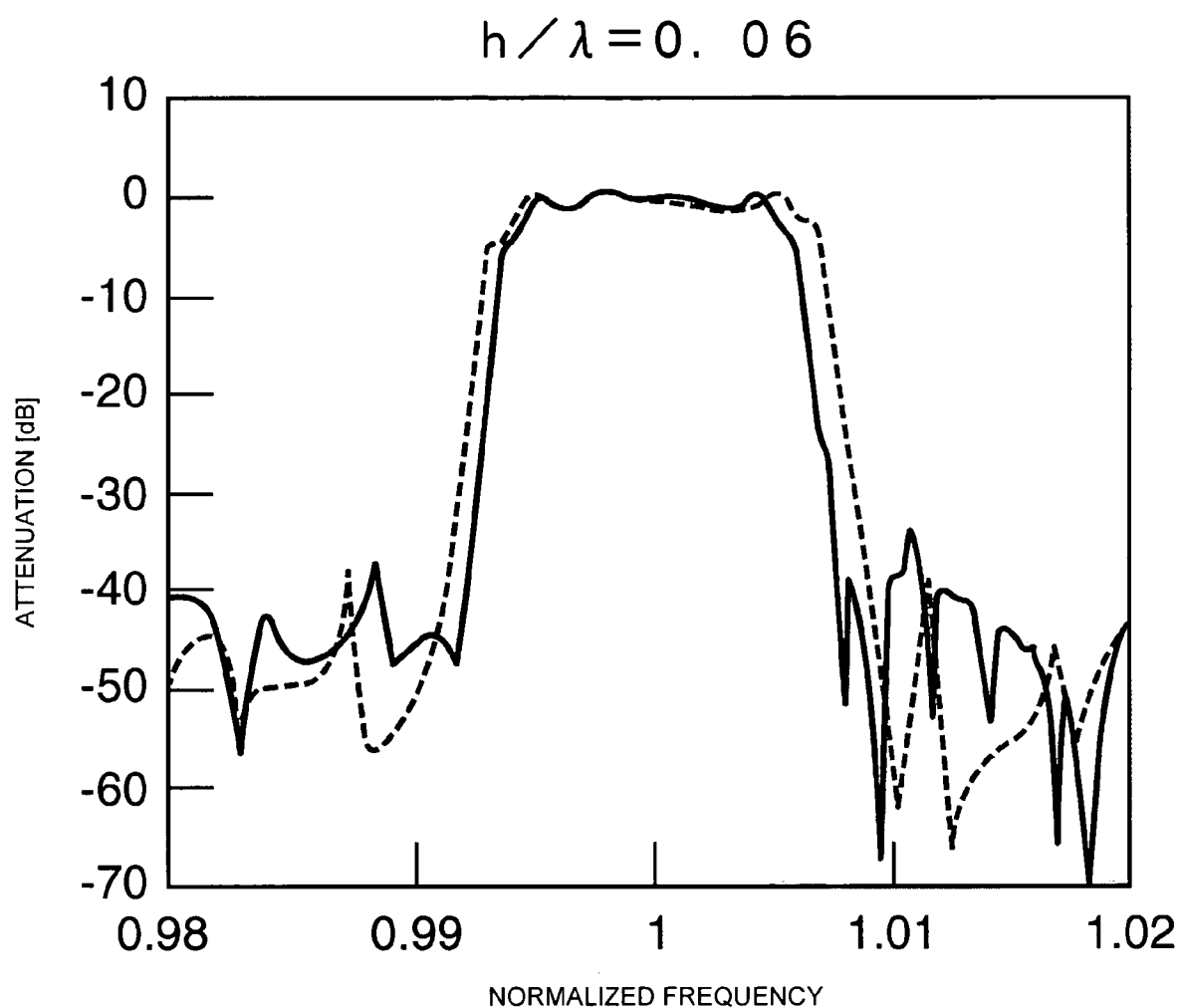
FIG. 2 shows a measurement waveform obtained when the surface acoustic wave filter having an electrode film thickness ratio of about 0.06 is measured in a first preferred embodiment, and a simulation waveform obtained by simulation not taking into account the velocity-dispersion.

FIG. 2 is a graph showing the attenuation—frequency characteristic of the surface acoustic wave filter 1 of this preferred embodiment configured as described above. The solid line represents a curve formed by plotting measurements, while the broken line represents simulation results obtained according to a mode coupling theory (COM). The shape factors, obtained by the measurements and the simulation results, are substantially the same. As seen in the graph of FIG. 2, the waveform obtained by the measurements shows a narrow bandwidth as compared to the waveform by the simulation results.

The bandwidth shown by the simulation waveform is not coincident with that by the measurement waveform, although the excitation and reflection of a surface acoustic wave in IDT are taken into account in the simulation. Thus, the inventors of the present invention have investigated the cause of the above-described non-coincidence. As a result, the inventors have supposed that when the thickness of the IDT electrodes 3 and 4 is large, the velocity-dispersion of the surface acoustic wave is increased, which may exert an influence over the bandwidth, such that the measurement waveform exhibits a narrow bandwidth as compared to that obtained by the simulation results. That is, the inventors have supposed that the velocity dispersion, which is thought not to appear in ordinary cases, may be exhibited when the electrode film thickness is increased.

Thus, the simulation was carried out again, in which a sound velocity V was determined according to formula (1) taking into account the velocity dispersion in the above-described simulation.

$$V = V_0 + A_1 \cdot \{(f-fc)/fc\} \cdot V_0 \qquad (1)$$

wherein V represents the velocity of a surface acoustic wave, $V_0$ represents the sound velocity of the surface acoustic wave on a free surface, $A_1$ represents the first coefficient of the velocity-dispersion, f represents the frequency at each calculation point, and fc represents the center frequency.

Figure 3:
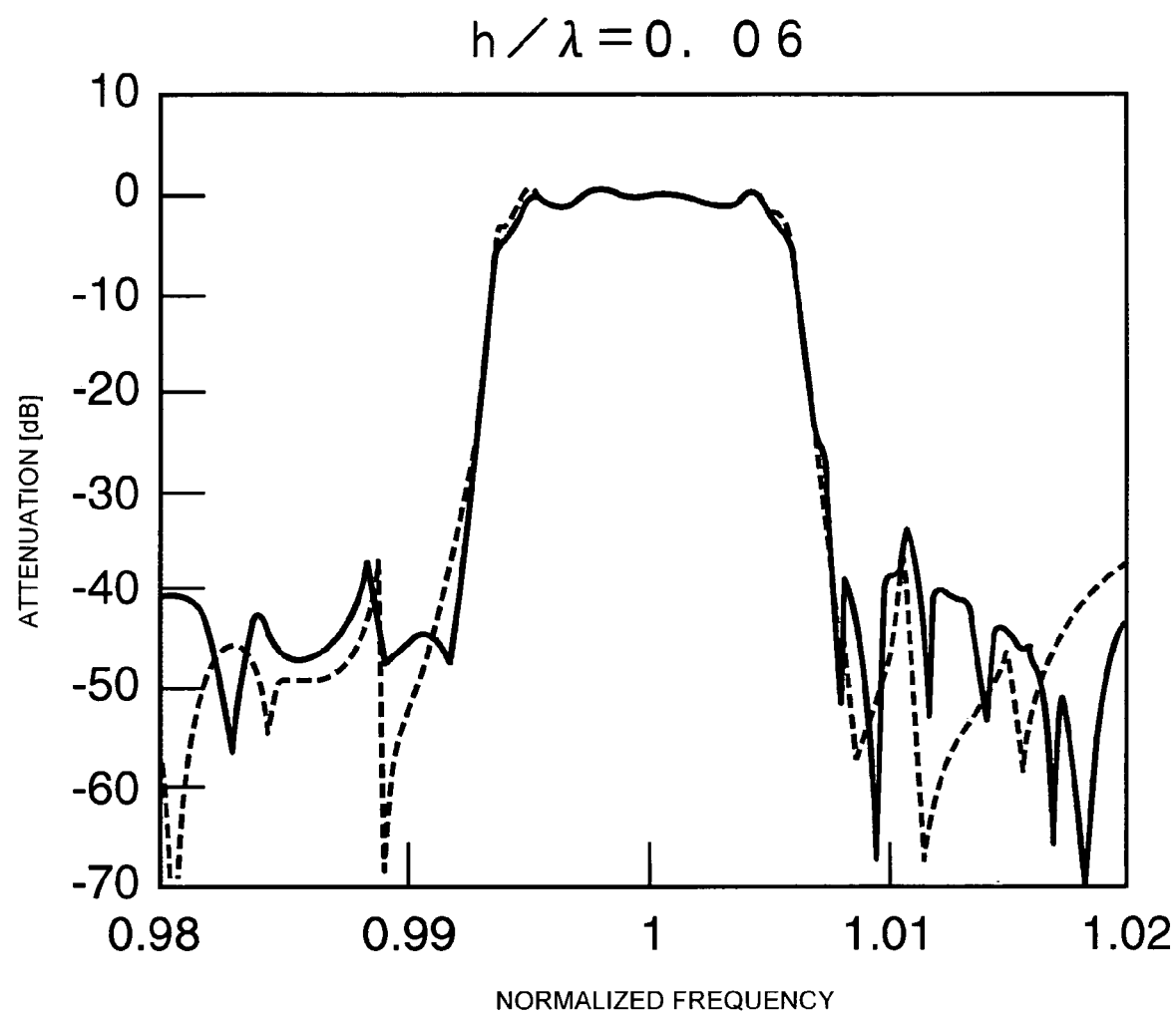
FIG. 3 shows the measurement waveform in the first preferred embodiment and a simulation waveform obtained by simulation taking into account the velocity-dispersion.

The velocity-dispersion according to the above-described formula (1) was taken into account, and the simulation was carried out again. The first coefficient of the velocity-dispersion was varied in the simulation taking into account the velocity-dispersion. Referring to the simulation results, FIG. 3 is a graph showing the simulation waveform obtained when the first coefficient of the velocity-dispersion was about −0.127. In FIG. 3, for comparison, the waveform obtained by the measurements shown in FIG. 2 is shown in the solid line.

As seen in FIG. 3, the bandwidth of the simulation waveform is substantially coincident with that of the measurement waveform, when the first coefficient of the velocity-dispersion is set at about −0.127. In particular, as seen in the simulation results, when the electrode film thickness ratio is about 0.06, the first coefficient of the velocity-dispersion is approximately −0.127. That is, it has been confirmed that the velocity-dispersion is also exhibited on the crystal substrate. According to this preferred embodiment, a surface acoustic wave filter is provided which has a narrow bandwidth, while maintaining the superior shape factor.

Second Preferred Embodiment

In the second preferred embodiment, an ST-cut crystal substrate with an Euler's angle (0, 119, 75, 0) was preferably used as the crystal substrate 2. An Al film was formed on the overall surface of the crystal substrate so as to have an electrode film thickness ratio of about 0.04 and wet-etched. Thus, the input-side IDT electrode 3 and the output-side IDT electrode 4, including the SPUDT electrodes, were preferably formed by wet-etching. The SPUDT electrodes, having an EWC structure (Electric Width Controlled Structure), were preferably used. Thus, a flat-plane surface acoustic wave filter having a size of about 5.0× about 11.4 mm, for example, was prepared.

Figure 4:
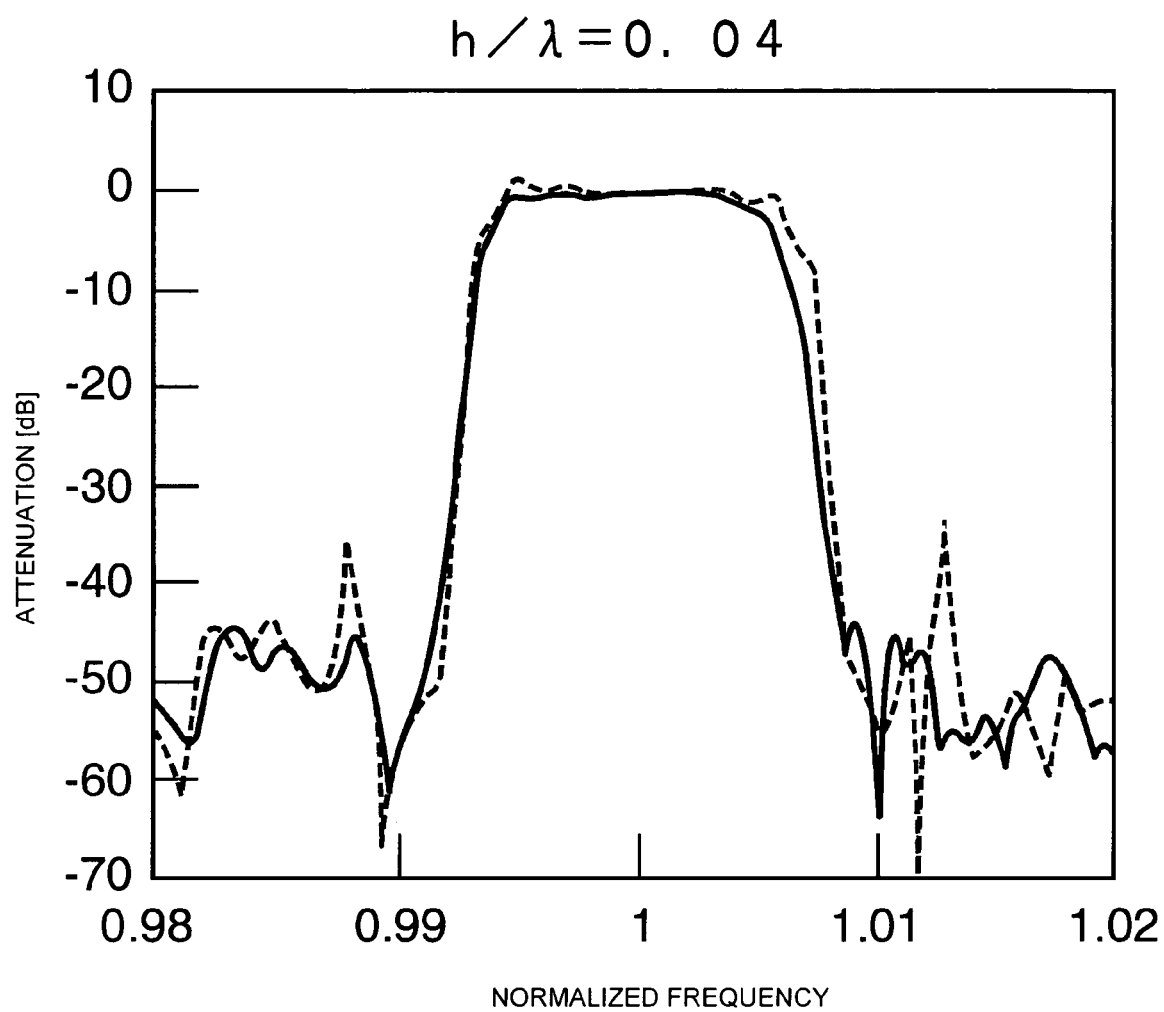
FIG. 4 shows a measurement waveform of a surface acoustic wave filter having an electrode film thickness ratio h/λ of about 0.04 of a second preferred embodiment and a simulation waveform obtained by simulation not taking into account the velocity-dispersion.

The attenuation-frequency characteristic of the surface acoustic wave filter prepared as described above was determined. In FIG. 4, a simulation waveform, not taking account of the velocity-dispersion, is drawn in a broken line. The measurement waveform shows a narrower bandwidth than the simulation waveform, although the narrowing degree is not so large as in the first preferred embodiment.

Subsequently, the simulation taking account of the velocity-dispersion according to formula (1), in which the first coefficient of the velocity-dispersion was varied, was conducted. As a result, a simulation waveform shown by a broken line in FIG. 5 was obtained, in which the first coefficient of the velocity-dispersion was about −0.032. The waveform drawn in the solid line in FIG. 5 is the same as the measurement waveform shown in the solid line in FIG. 4.

Figure 5:
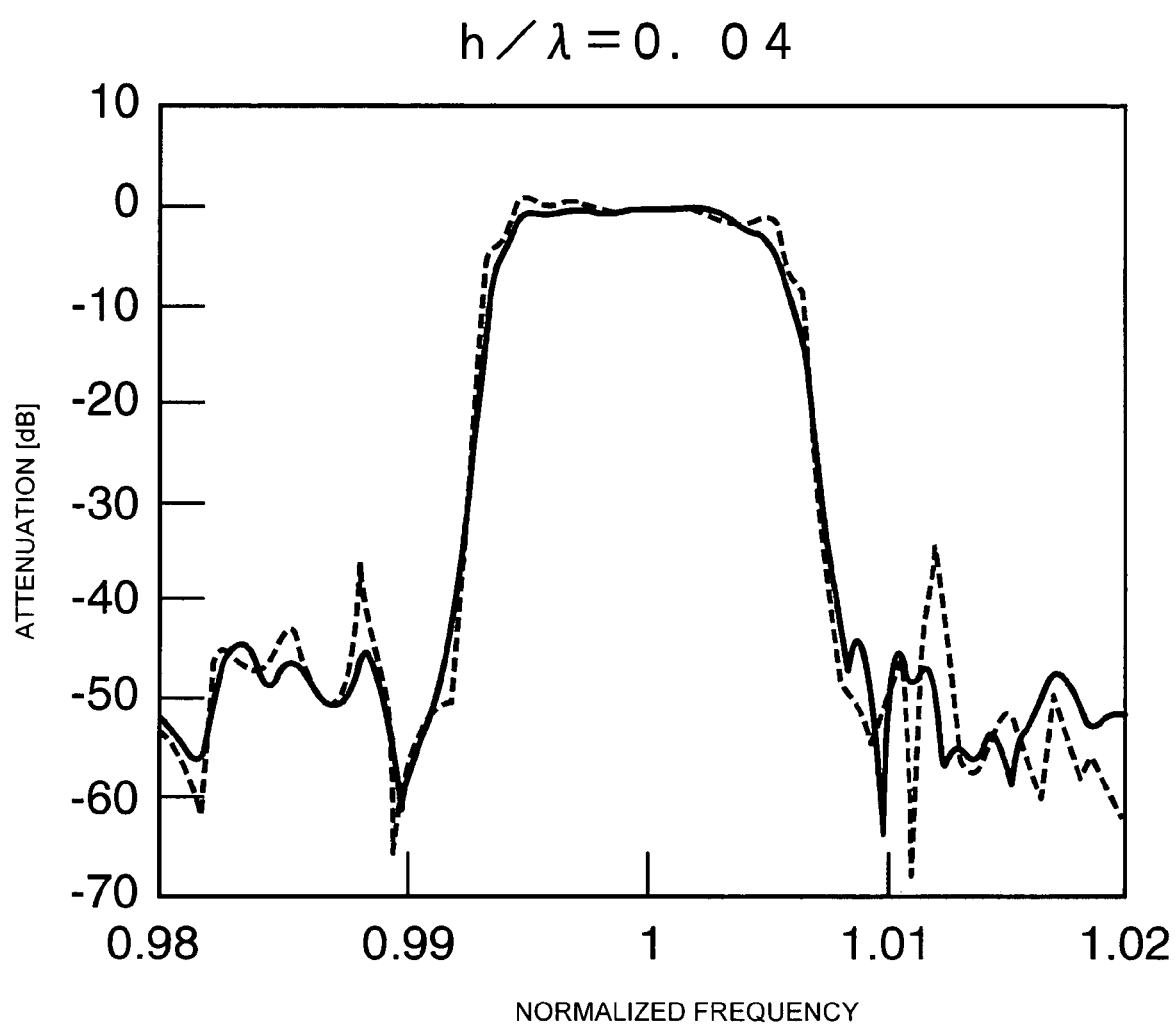
FIG. 5 shows a measurement waveform of the surface acoustic wave filter having an electrode film thickness ratio h/λ of about 0.04 of the second preferred embodiment and a simulation waveform obtained by simulation taking into account the velocity-dispersion.

As seen in FIG. 5, when the first coefficient of the velocity-dispersion is about −0.032, the bandwidth shown by the measurement waveform is substantially coincident with that by the simulation waveform.

Figure 6:
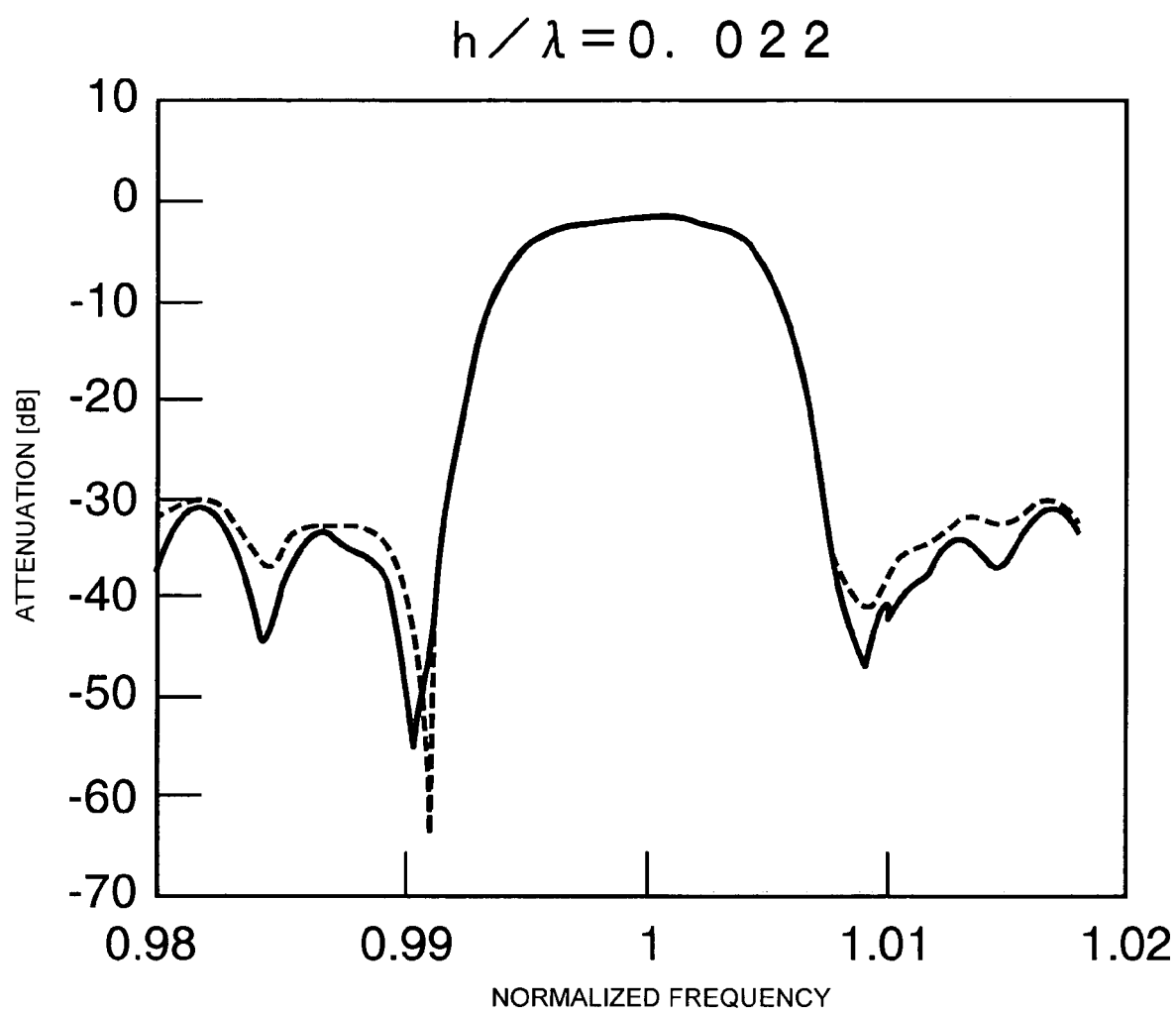
FIG. 6 shows filter waveforms of a surface acoustic wave filter having an electrode film thickness ratio h/λ of about 0.022, in which the solid line represents the measurement waveform, and the broken line represents the simulation waveform obtained by simulation not taking into account the velocity-dispersion.

Subsequently, a surface acoustic wave filter was prepared in the same manner as in the second preferred embodiment except that the electrode film thickness ratio was about 0.022. Then, the attenuation-frequency characteristic was determined. The results were shown by the solid line in FIG. 6. In FIG. 6, the broken line shows the simulation waveform obtained by the simulation not taking account of the velocity-dispersion.

As seen in FIG. 6, when the electrode film thickness ratio is about 0.022, the bandwidth of the simulation waveform is substantially coincident with that of the measurement waveform.

Figure 7:
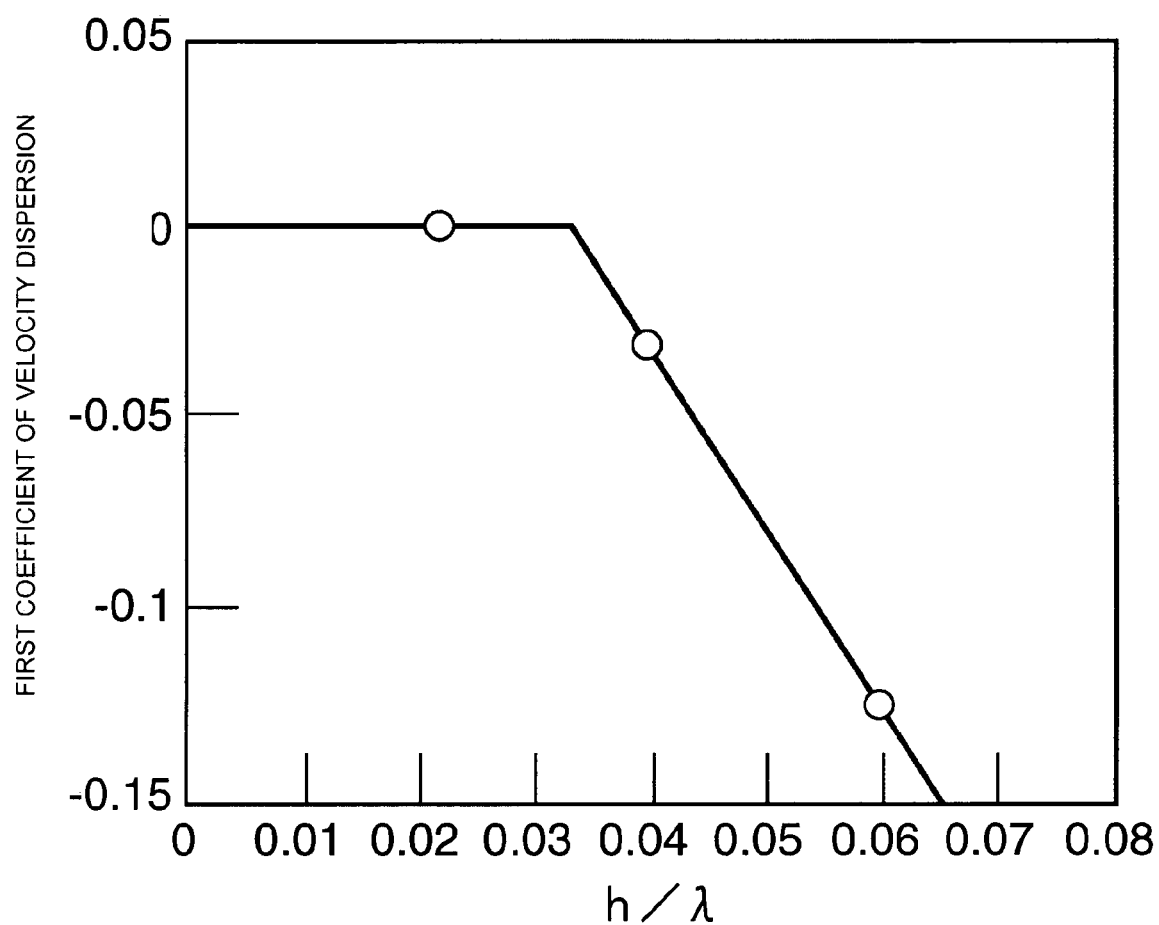
FIG. 7 is a graph showing a correlation between the electrode film thickness ratio h/λ and the first coefficient of velocity-dispersion.

As described above, when the first coefficients of the velocity-dispersions are set at about −0.127 and about −0.032 in the first and second preferred embodiments, respectively, the measurement waveform and the simulation waveform are substantially coincident with each other. Moreover, it is seen that when the electrode film thickness ratio is about 0.022, the bandwidth of the simulation waveform is coincident with that of the measurement waveform, even though the velocity-dispersion is not taken into account. Thus, based on the above-described results, the inventors of the present invention have determined that there is a correlation between the electrode film thickness ratio h/λ and the first coefficient of the velocity-dispersion, and thus, have plotted the ratio h/λ and the first coefficient to illustrate the relation between them. FIG. 7 shows the results.

As seen in FIG. 7, when the electrode film thickness ratio exceeds about 0.035, the velocity-dispersion is not negligible. Thus, the absolute value of the first coefficient of the velocity-dispersion increases with an increase of the electrode film thickness ratio h/λ. Accordingly, the bandwidth of the surface acoustic wave filter is reduced by setting the electrode film thickness ratio such that the first coefficient of the velocity-dispersion has a negative value, and the absolute value is relatively large, although the number of the pairs of electrodes is not increased.

In other words, as seen in FIG. 7, the above-described narrow bandwidth as a filter-characteristic is obtained by setting the electrode film thickness ratio at a value greater than about 0.035 and also setting the first coefficient of the velocity-dispersion at a negative value.

Figure 8:
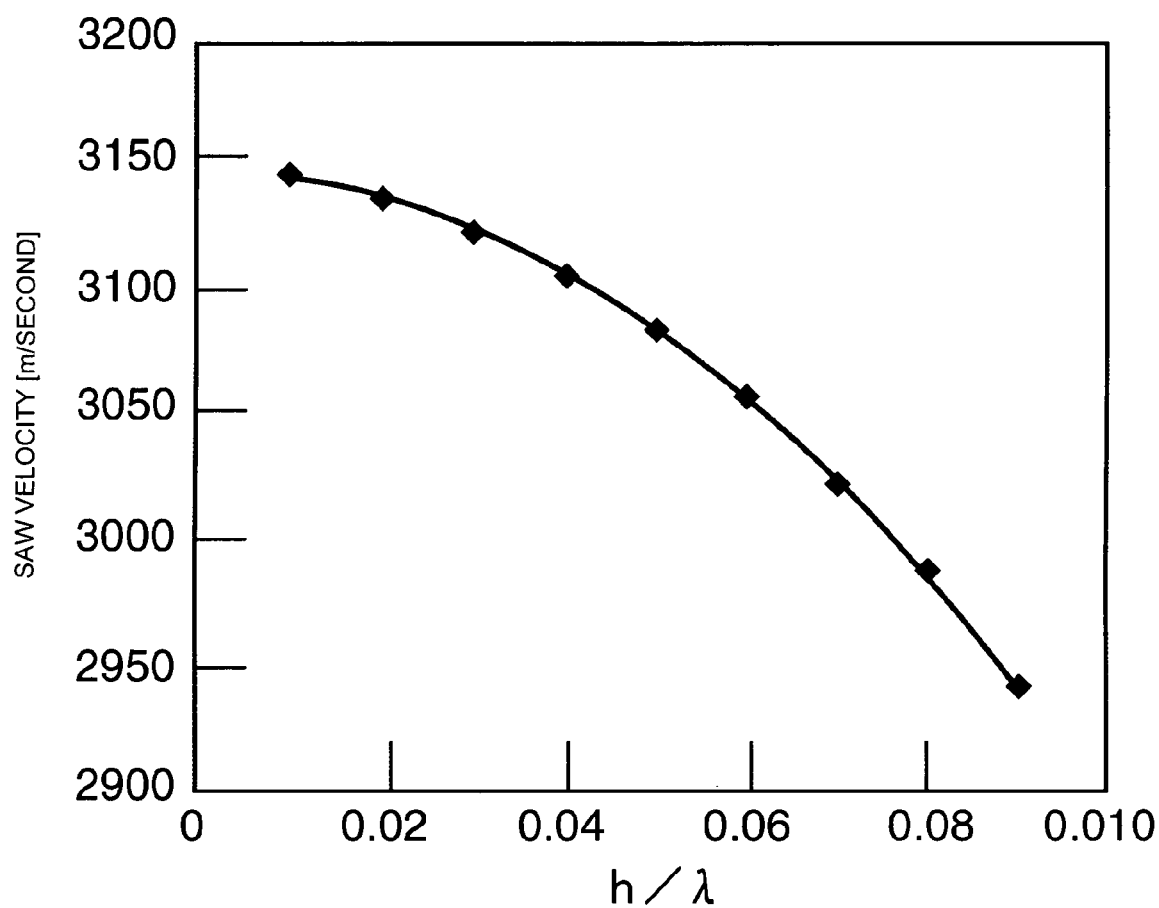
FIG. 8 is a graph showing a correlation between the electrode film thickness ratio h/λ and the sound velocity.

Electrode films having different electrode film thickness ratios were provided on crystal substrates with an Euler's angle (0, 123, 5, 0). The sound velocities of the surface acoustic waves were determined by a finite element method. FIG. 8 shows a correlation between the electrode film thickness ratio and the sound velocity. As seen in FIG. 7, the first coefficient of the velocity-dispersion has a negative value when the electrode film thickness ratio exceeds about 0.035. Moreover, as seen in FIG. 8, the change of the sound velocity based on the change of the electrode film thickness ratio becomes large when the electrode film thickness ratio exceeds about 0.035.

When the frequency deviates from a target center frequency fc in the surface acoustic wave filter, the wavelength λ of the surface acoustic wave deviates from the wavelength λc corresponding to the center frequency. Therefore, when the frequency is shifted from the target center frequency fc by Δf, the electrode film thickness ratio is changed. That is, when the electrode film thickness ratios h/λ are different, the change of the sound velocity is greater for the large electrode film thickness ratio than that for the small electrode film thickness ratio on the condition that the shifts Δf of the frequencies are the same.

As seen in the results of FIGS. 1 to 8, the first coefficient of the velocity-dispersion can be adjusted to have a negative value by setting the electrode film thickness ratio at a value greater than about 0.035 in the transversal type surface acoustic wave filter, and also, the bandwidth can be reduced, although the number of the pairs of electrodes is not increased. Especially, when the SPUDT electrodes are provided, the reflection coefficient increases when the electrode film thickness ratio increases. Thus, the shape factor is efficiently improved.

However, if the electrode film thickness ratio h/λ becomes excessively large, it is difficult to form the electrodes. If the center frequency is high, the electrode pitch must be small. If the center frequency is low, the electrode film thickness ratio must be increased. Thus, the electrode film thickness ratio has an upper limit because of the difficulties in production. When an electrode-forming method such as wet-etching, dry-etching or lifting-off is used, the upper limit of the electrode film thickness ratio is about 0.06.

Thus, according to preferred embodiments of the present invention, the bandwidth of the surface acoustic wave filter is reduced, as described above, since the electrode film thickness ratio is in the range of about 0.035 to about 0.06, and moreover, the first coefficient of the velocity-dispersion has a negative value. Especially, when the IDT electrodes include the SPUDT electrodes, the shape factor is improved.

On the other hand, to improve the frequency-temperature characteristic of the surface acoustic wave filter, the cut-angle of a crystal substrate must be selected such that the temperature at the vertex in the frequency-temperature dependence curve prepared for each electrode film thickness ratio exists in the vicinity to the center of an operation temperature range, ordinarily in the vicinity to a room temperature. The angle θ of an ST-cut crystal substrate having an Euler's angle expressed as (0, θ, 0) is selected for each electrode film thickness ratio h/λ.

Figure 9:
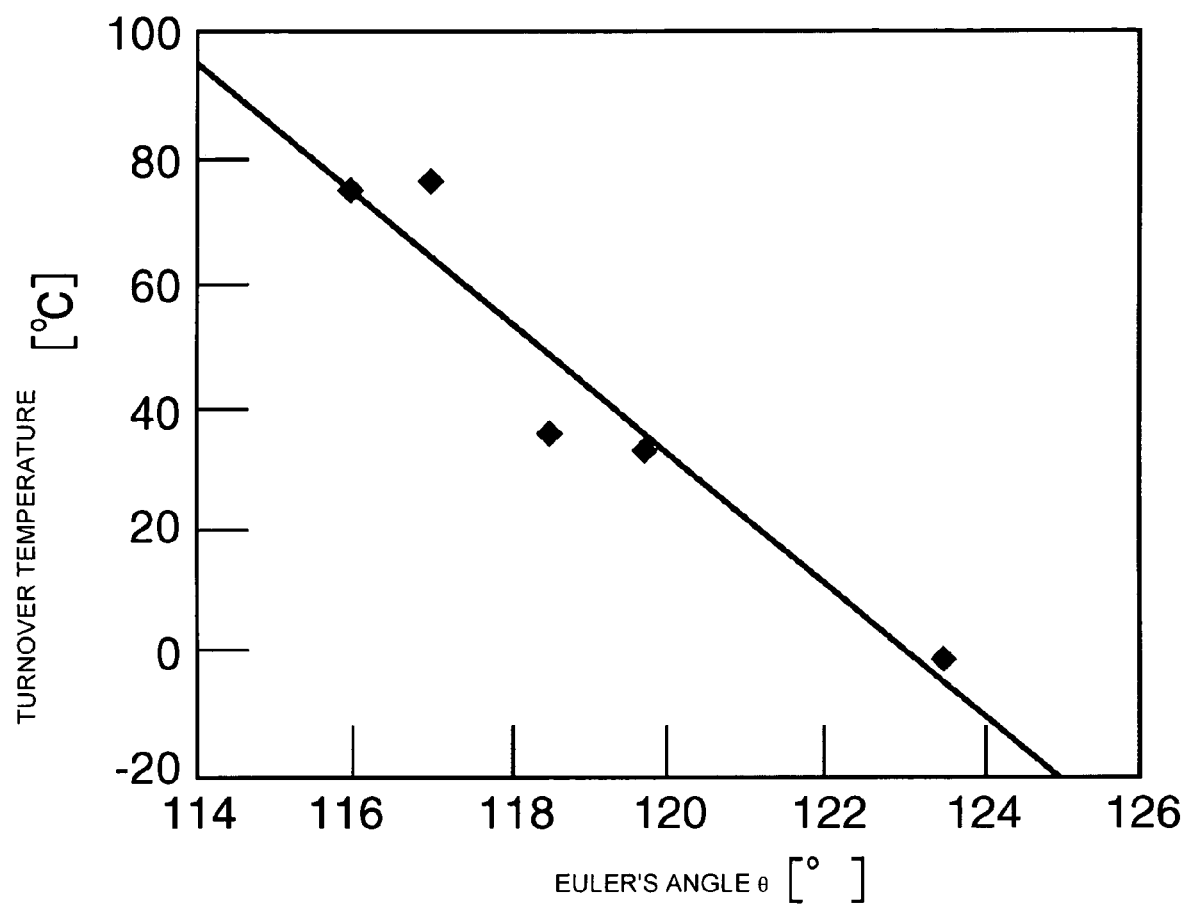
FIG. 9 is a graph showing a correlation between the angle θ of the Euler's angle (0, θ, 0) and the vortex temperature.

FIG. 9 shows the change of the temperature at the vertex of the frequency, obtained when the Euler's angle θ was changed at an electrode film thickness ratio h/λ of about 0.04. As seen in FIG. 9, when the angle θ is increased by about 1(, the vertex temperature is decreased by about 10° C.

Figure 10:
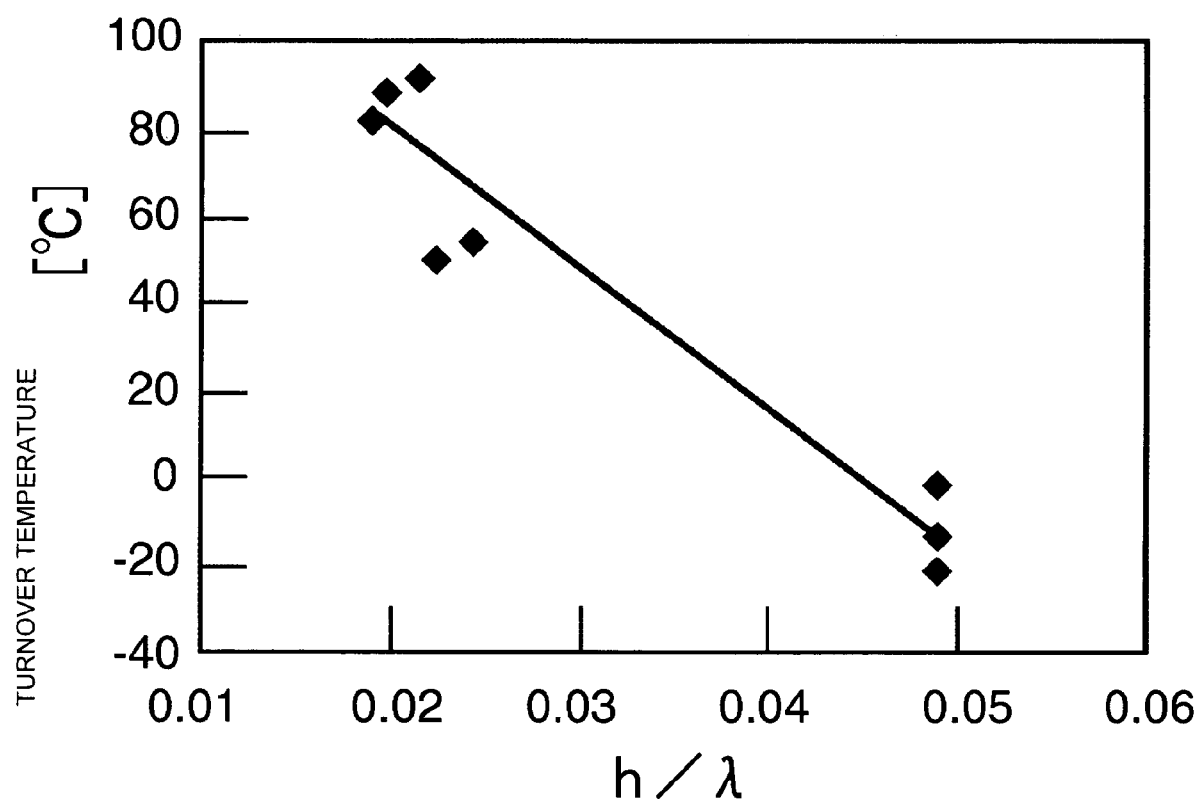
FIG. 10 is a graph showing a correlation between the electrode film thickness ratio h/λ and the vortex temperature.

On the other hand, the change of the vortex temperature was determined with the electrode film thickness ratio of the surface acoustic wave filter being varied. In this case, a ST-cut crystal substrate with an Euler's angle (0, 122°, 0) was used. FIG. 10 shows the results.

As seen in FIG. 10, when the electrode film thickness ratio h/λ is increased by about 0.01, the vertex temperature is decreased by about 30° C.

Thus, in view of the fact that the vortex temperature is about 25° C. in the first preferred embodiment, and also the results shown in FIGS. 9 and 10, it is seen that for setting the vortex temperature at a value in the vicinity to room temperature, it is required to meet the following formula (2).

$$\theta = \{-3 \cdot \{(h/\lambda) \times 100\} + 134\} \quad (2)$$

Generally, the lower limits of the use temperature ranges of components in portable telephones are in the range of about −40° C. to about −20° C., and the upper limits are in the range of about +75° C. to about +85° C. That is, there is a variation of about 10° C. to about 20° C. on the high temperature side and on the low temperature side. Therefore, the target vortex temperature is changed by about 10° C. to about 20° C., depending upon the required characteristics. Therefore, preferably, an allowance of about ±1° is added to formula (2) to give formula (3).

$$\theta = \{-3 \cdot \{(h/\lambda) \times 100\} + 134\} \pm 1 \quad (3)$$

As seen in the above description, a surface acoustic wave filter having a small size and bandwidth, and a high temperature stability is provided by setting the electrode film thickness ratio at a value in the range of about 0.035 to about 0.06, and moreover, selecting the cut-angle of a crystal substrate so as to satisfy formula (3).

Figure 11:
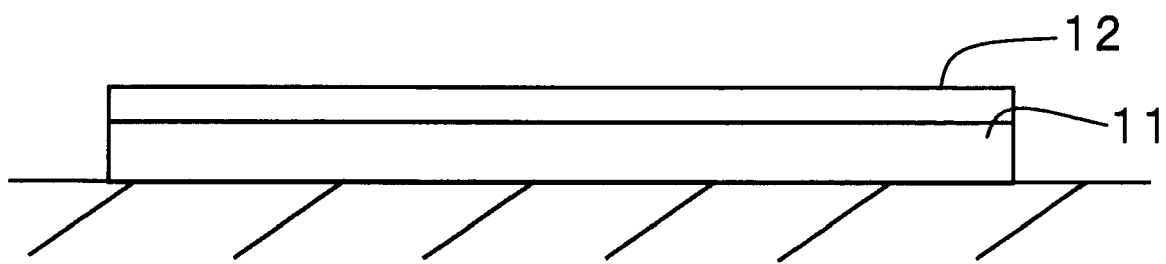
FIG. 11 is a partially cut-away cross-sectional view of a structure in which another electrode layer is laminated on an electrode layer made of Al.

Moreover, in the above description, the input side IDT electrodes and the output IDT electrodes are preferably formed of Al. Also, the IDT electrodes may be formed of an Al base alloy. Moreover, as shown in FIG. 11, at least electrode layer 12 made of a metal excluding Al may be laminated to an electrode layer 11 made of Al or an Al alloy. Also, in this case, the first coefficient of the velocity-dispersion has a negative value by setting the electrode film thickness ratio so as to be in the above-described particular range, provided that Al is a major component of the entire electrodes. Thus, the advantages of the present invention are obtained.

Hereinafter, the reason for which the bandwidth is reduced when the first coefficient of the velocity-dispersion has a negative value will be described with reference to FIGS. 12A, 12B, and 13.

Figure 12A:
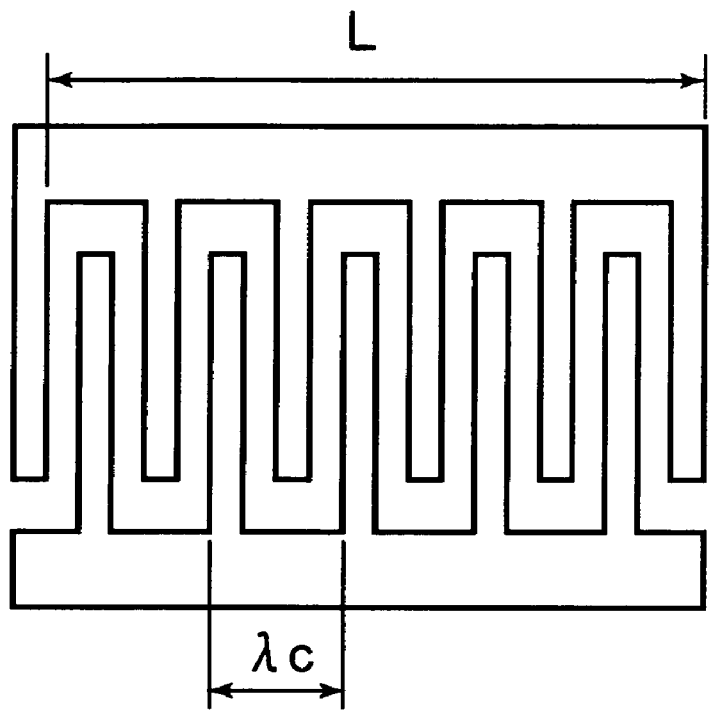
FIG. 12A is a schematic plan view of IDT used in a transversal type surface acoustic wave filter.

FIG. 12A is a schematic plan view of one IDT of the universal type surface acoustic wave filter. FIG. 12B is a graph showing the characteristic of the universal type surface acoustic wave filter.

The number N of the pairs of electrodes included in the IDT shown in FIG. 12A, the center frequency fc of the surface acoustic wave filter, the bandwidth Δf, the wavelength λ, the length L of the IDT, and the sound velocity V satisfy the following formulae (4) to (6).

$$\Delta f / fc = 2/N \quad (4)$$

$$V = f \cdot \lambda \quad (5)$$

$$L = N \lambda c \quad (6)$$

Figure 12B:
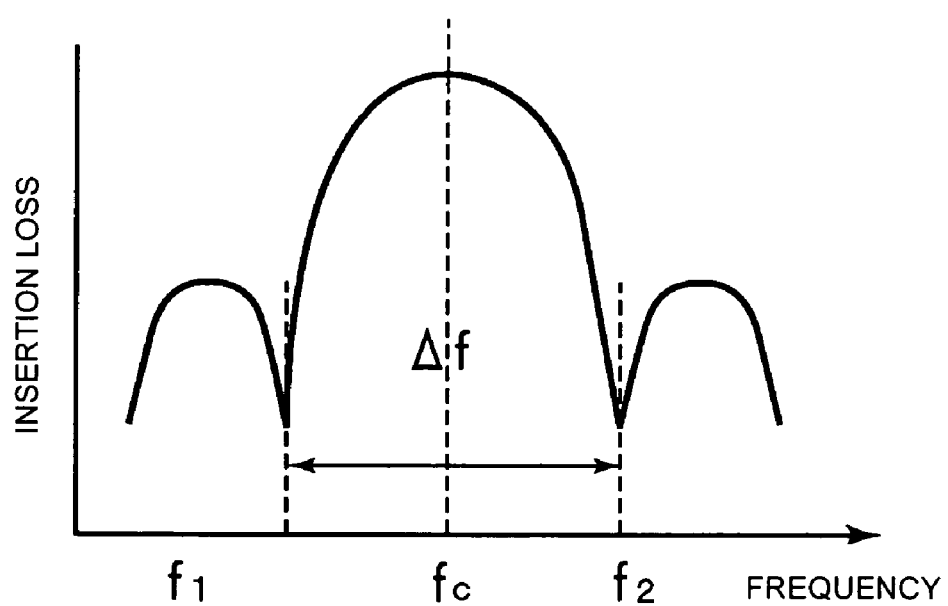
FIG. 12B is a graph showing the frequency characteristic of the surface acoustic wave filter.

The attenuation poles are generated at $f_1$ and $f_2$ in FIG. 12B. This is because the following formulae (7) and (8) are established, wherein $\lambda_1$ and $\lambda_2$ represent the wavelengths at the frequencies $f_1$ and $f_2$, respectively.

$$L = (N-1)\lambda_1 \quad (7)$$

$$L = (N+1)\lambda_2 \quad (8)$$

That is, the number of phase-cycles carried out in the IDT is smaller or larger by one cycle at the frequency $f_1$ or $f_2$ than that at the center frequency fc. Thus, no excitation is caused in the IDT.

Referring to the frequency $f_1$ under the above-described premise, formulae (5) and (6) gives the following formulae, $$N \lambda c = (N-1) \lambda_1$$

$$NVc/fc = (N-1)V_1/f_1$$

$$f_1 = \{(N-1)V_1/NVc\} \cdot fc$$

$$f_1 = (N-1)/N \cdot (V_1/Vc) \cdot fc \quad (9)$$

wherein $V_1$ and $V_2$ represent the sound velocities at the frequency $f_1$ and the center frequency fc in the case where the velocity-dispersion is present.

Figure 13:
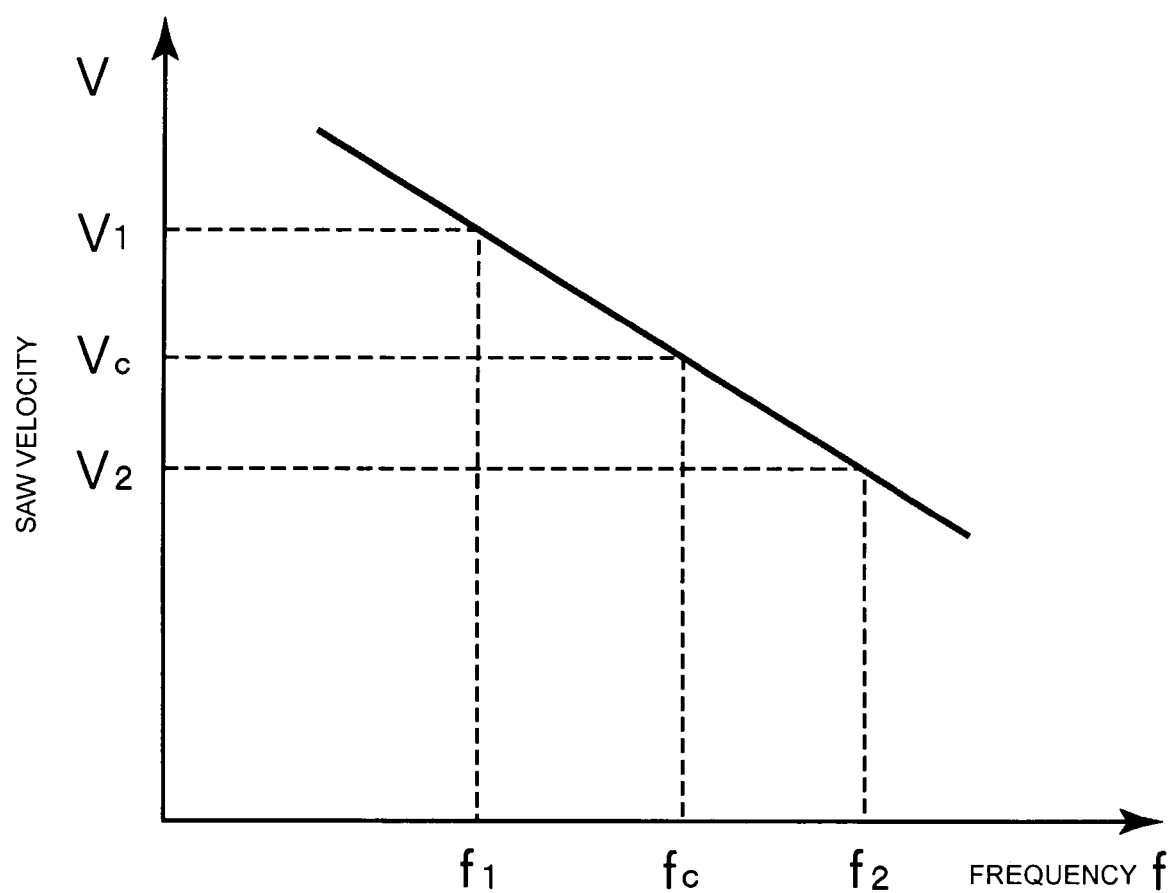
FIG. 13 is a graph showing a correlation between the frequency, obtained when the first coefficient of the velocity-dispersion has a negative value, and the sound velocity.

On the other hand, when the first coefficient of the velocity-dispersion has a negative value, $V_1>Vc$ is effective, as seen in FIG. 13.

Accordingly, when the velocity-dispersion is present, the frequency $f_1$ is increased to reach the center frequency fc as compared to the case in which no velocity-dispersion is present, i.e., at $V_1=Vc$.

Similarly, formulae (6) and (8) give formula (10)

$$f_2=(N+1)/N\cdot(V_2/Vc)\cdot fc \quad (10)$$

When the first coefficient of the velocity-dispersion has a negative value, $V_2<Vc$. Thus, the frequency $f_2$ is less as compared to the case in which no velocity-dispersion is present ($V_1=Vc$), and approaches the center frequency fc.

Thus, it is seen that when the first coefficient of the velocity-dispersion has a negative value, the bandwidth $\Delta=f_2-f_1$ is reduced.

As described above, the shape factor of the filter characteristic is improved by setting the coefficient of the velocity-dispersion at a negative value. This means that the improvement of the shape factor is not restricted to the structure in which the interdigital electrodes of Al are provided on a crystal substrate. The shape factor can be also improved by another combination of a piezoelectric substrate with an electrode material, provided that the first coefficient of the velocity-dispersion has a negative value.

The present invention is not limited to the above-described preferred embodiments, but can be modified in the scope of the attached claims. Further, the technologies disclosed in the above-described preferred embodiments can be used in combination, as desired.

What is claimed is:

1. A surface acoustic wave filter comprising:
   a piezoelectric substrate; and
   an input-side IDT electrode and an output-side IDT electrode arranged on the piezoelectric substrate so as to be separated from each other in the propagation direction of a surface acoustic wave; wherein
   the piezoelectric substrate is a crystal substrate;
   the input-side IDT electrode and the output-side IDT electrode each include an electrode layer made of Al or an Al alloy defining a major electrode layer, and the electrode film thickness ratio $h/\lambda$ is in the range of from about 0.035 to about 0.06, wherein h represents the film-thickness of the input-side IDT electrode and the output-side IDT electrode, and $\lambda$ represents the wavelength of the surface acoustic wave;
   at least one of the input-side IDT electrode and the output-side IDT electrode is an SPUDT electrode; and
   the crystal substrate is an ST-cut crystal substrate having an Euler's angle $(0, \theta, 0)$, and the angle $\theta$ is in the range represented by $\theta=\{-3\cdot(h/\lambda)\times100+134\}\pm1$.

2. A surface acoustic wave filter according to claim 1, further comprising at least one electrode layer laminated to the electrode layer made of Al or an Al alloy, the at least one electrode layer being made of a metal excluding Al.

3. A surface acoustic wave filter according to claim 1, further comprising a shield electrode provided between the input-side IDT electrode and the output-side IDT electrode.

4. A surface acoustic wave filter according to claim 1, wherein each of the input-side IDT electrode and the output-side IDT electrode has a thickness at which a velocity-dispersion of the filter has a negative value.

* * * * *